United States Patent
Wang et al.

(10) Patent No.: US 12,089,394 B2
(45) Date of Patent: Sep. 10, 2024

(54) SEMICONDUCTOR STRUCTURE

(71) Applicant: Winbond Electronics Corp., Taichung (TW)

(72) Inventors: Chi-An Wang, Taichung (TW); Kai Jen, Taichung (TW); Wei-Che Chang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/947,172

(22) Filed: Sep. 19, 2022

(65) Prior Publication Data

US 2023/0012828 A1    Jan. 19, 2023

Related U.S. Application Data

(62) Division of application No. 17/121,765, filed on Dec. 15, 2020, now Pat. No. 11,495,605.

(30) Foreign Application Priority Data

Sep. 1, 2020  (TW) ................................ 109129814

(51) Int. Cl.
*H01L 23/522* (2006.01)
*H10B 12/00* (2023.01)

(52) U.S. Cl.
CPC ......... *H10B 12/09* (2023.02); *H10B 12/0335* (2023.02); *H10B 12/31* (2023.02); *H10B 12/50* (2023.02)

(58) Field of Classification Search
CPC .... H10B 12/09; H10B 12/0335; H10B 12/31; H10B 12/50; H10B 12/30; H01L 28/60; H01L 28/40
See application file for complete search history.

(56) References Cited

U.S. PATENT DOCUMENTS

2010/0127316 A1*  5/2010  Tu ........................ H01L 27/0255
                                                                        257/296
2021/0118618 A1*  4/2021  Shin ...................... H01L 23/642

FOREIGN PATENT DOCUMENTS

| CN | 1979850 | 6/2007 |
|---|---|---|
| CN | 101740572 | 6/2010 |
| CN | 101826560 | 9/2010 |
| CN | 102456750 | 5/2012 |
| CN | 103383933 | 11/2013 |
| CN | 104681497 | 6/2015 |
| CN | 107579037 | 1/2018 |
| CN | 111463215 | 7/2020 |

(Continued)

OTHER PUBLICATIONS

"Office Action of China Counterpart Application", issued on Apr. 11, 2024, p. 1-p. 8.

*Primary Examiner* — Samuel Park

(74) *Attorney, Agent, or Firm* — JCIPRNET

(57) ABSTRACT

Provided are a semiconductor structure and a manufacturing method thereof. The semiconductor structure includes a substrate having a capacitor region and a periphery region and a capacitor. A transistor is disposed in the substrate in the capacitor region, and a conductive device is disposed in the substrate in the periphery region. The capacitor is disposed on the substrate in the capacitor region and electrically connected to the transistor, wherein an upper electrode layer of the capacitor does not extend into the periphery region.

9 Claims, 7 Drawing Sheets

(56) References Cited

FOREIGN PATENT DOCUMENTS

| | | |
|---|---|---|
| JP | 2002190583 | 7/2002 |
| JP | 2009260385 | 11/2009 |
| JP | 2016048707 | 4/2016 |
| KR | 20010056084 | 7/2001 |
| KR | 20050028749 | 3/2005 |
| KR | 20050033672 | 4/2005 |
| TW | 382814 | 2/2000 |
| WO | 9828795 | 7/1998 |

* cited by examiner

SEMICONDUCTOR STRUCTURE

CROSS-REFERENCE TO RELATED APPLICATION

This application is a divisional application of and claims the priority benefit of U.S. application Ser. No. 17/121,765, filed on Dec. 15, 2020, which claims the priority benefit of Taiwan application serial no. 109129814, filed on Sep. 1, 2020. The entirety of each of the above-mentioned patent applications is hereby incorporated by reference herein and made a part of this specification.

BACKGROUND

Technical Field

The invention relates to a semiconductor structure and a manufacturing method thereof.

Description of Related Art

In a memory structure, a memory array is disposed in a cell region as a storage device. In addition, other electronic devices are disposed in a periphery region outside the cell region, and a voltage is applied to the electronic devices through contacts connected to the electronic devices.

Generally speaking, in the process of forming a metal-insulator-metal (MIM) capacitor, a lower electrode and an insulating layer are sequentially defined on a substrate, and then a metal layer is formed on the substrate. Then, a patterning process is performed on the metal layer to define an upper electrode. In the above patterning process, a photoresist layer is used to define the pattern of the upper electrode, and then an anisotropic etching process is performed to remove the metal layer not covered by the photoresist layer. However, in order to ensure that the formed upper electrode can completely overlap the insulating layer and the lower electrode, the photoresist layer not only covers the metal layer in the capacitor region, but also covers the metal layer adjacent to the capacitor region in the periphery region to prevent the metal layer in the capacitor region from being removed during etching.

However, the above method causes the formed upper electrode to extend into the periphery region. Since the contacts in the periphery region must be spaced a certain distance from the upper electrode extending into the periphery region to prevent short circuits, the area of the periphery region increases, which leads to an increase in chip size.

SUMMARY

The present invention provides a semiconductor structure and a manufacturing method thereof, in which the upper electrode of the capacitor in the capacitor region does not extend into the periphery region.

A semiconductor structure of the present invention includes a substrate having a capacitor region and a periphery region, and a capacitor. A transistor is disposed in the substrate in the capacitor region, and a conductive device is disposed in the substrate in the periphery region. The capacitor is disposed on the substrate in the capacitor region and electrically connected to the transistor, wherein an upper electrode layer of the capacitor does not extend into the periphery region.

A manufacturing method of the semiconductor structure of the present invention includes the following steps. A substrate having a capacitor region and a periphery region is provided, wherein a transistor is formed in the substrate in the capacitor region, and a conductive device is formed in the substrate in the periphery region. A capacitor is formed on the substrate in the capacitance region, wherein the capacitor is electrically connected to the transistor, and an upper electrode layer of the capacitor extends onto the substrate in the periphery region. A protective layer is formed on the upper electrode layer. A doped layer is formed in at least the surface of the protective layer in the capacitor region. An etching process is performed using the doped layer as a mask to remove the protective layer and the upper electrode layer in the periphery region.

Based on the above, in the manufacturing method of the semiconductor structure of the present invention, since the upper electrode layer in the periphery region has been completely removed, the position of the subsequently formed contact can be as close as possible to the capacitor in the capacitor region without being in contact with the capacitor. In this way, the distance between the contact and the capacitor region (or capacitor) can be minimized, and therefore the purpose of reducing the size of the chip can be achieved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
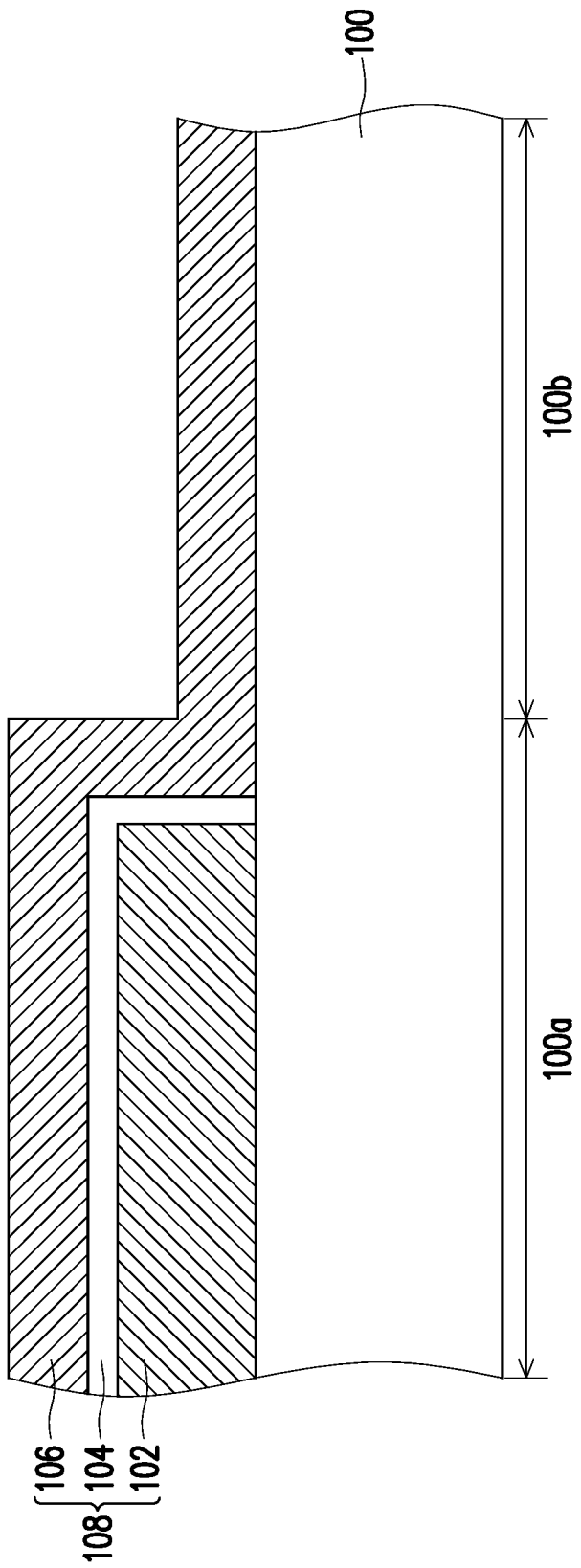
FIGS. 1A to 1G are schematic cross-sectional views of a manufacturing process of a semiconductor structure according to an embodiment of the present invention.

The embodiments are described in detail below with reference to the accompanying drawings, but the embodiments are not intended to limit the scope of the present invention. In addition, the drawings are for illustrative purposes only and are not drawn to the original dimensions. For the sake of easy understanding, the same elements in the following description will be denoted by the same reference numerals.

FIGS. 1A to 1G are schematic cross-sectional views of a manufacturing process of a semiconductor structure according to an embodiment of the present invention.

Referring to FIG. 1A, a substrate 100 is provided. In this embodiment, the substrate 100 is a dielectric substrate, which is, for example, a dielectric layer formed on a silicon substrate and covering electronic devices (such as transistors) disposed on the silicon substrate. The substrate 100 has a capacitor region 100*a* and a periphery region 100*b*. In this embodiment, in order to make the diagram clear, the above-mentioned silicon substrate and the electronic devices disposed thereon are not shown. The capacitor region 100*a* is a region for disposing the capacitor, and the capacitor is electrically connected to the transistor on the silicon substrate to form a dynamic random access memory (DRAM). The periphery region 100*b* is a region for disposing various electronic devices and circuit patterns, which is well known to those skilled in the art and will not be further described here.

Next, a conductive layer 102 is formed on the substrate 100 in the capacitor region 100a. The conductive layer 102 is, for example, a metal layer or a composite layer composed of a metal layer and a metal nitride layer, but the invention is not limited thereto. The conductive layer 102 is used as the bottom electrode of the capacitor. Then, a dielectric layer 104 is formed on the conductive layer 102. In this embodiment, the dielectric layer 104 only covers the surface of the conductive layer 102, but the invention is not limited thereto. In other embodiments, the dielectric layer 104 may also extend onto the surface of the substrate 100 in the periphery region 11b. The material of the dielectric layer 104 is, for example, a dielectric material having a high dielectric constant. For example, the dielectric layer 104 may be a composite layer composed of a zirconium oxide ($ZrO_2$) layer, an aluminum oxide ($Al_2O_3$) layer and a zirconium oxide layer, but the present invention is not limited thereto. The dielectric layer 104 is used as a capacitor dielectric layer of the capacitor. After that, a conductive layer 106 is conformally formed on the substrate 100. Therefore, in addition to being located in the capacitor region 100a, the conductive layer 106 will also extend onto the substrate 100 in the periphery region 100b. The conductive layer 106 is, for example, a metal layer or a composite layer composed of a metal layer and a metal nitride layer, but the invention is not limited thereto. The conductive layer 106 is used as the upper electrode of the capacitor. In this embodiment, the conductive layer 102, the dielectric layer 104 and the conductive layer 106 in the capacitor region 100a constitute the capacitor 108, and the conductive layer 102 (lower electrode) is electrically connected to the above-mentioned transistor on the silicon substrate by the contact (not shown) in the substrate 100.

Figure 1B:
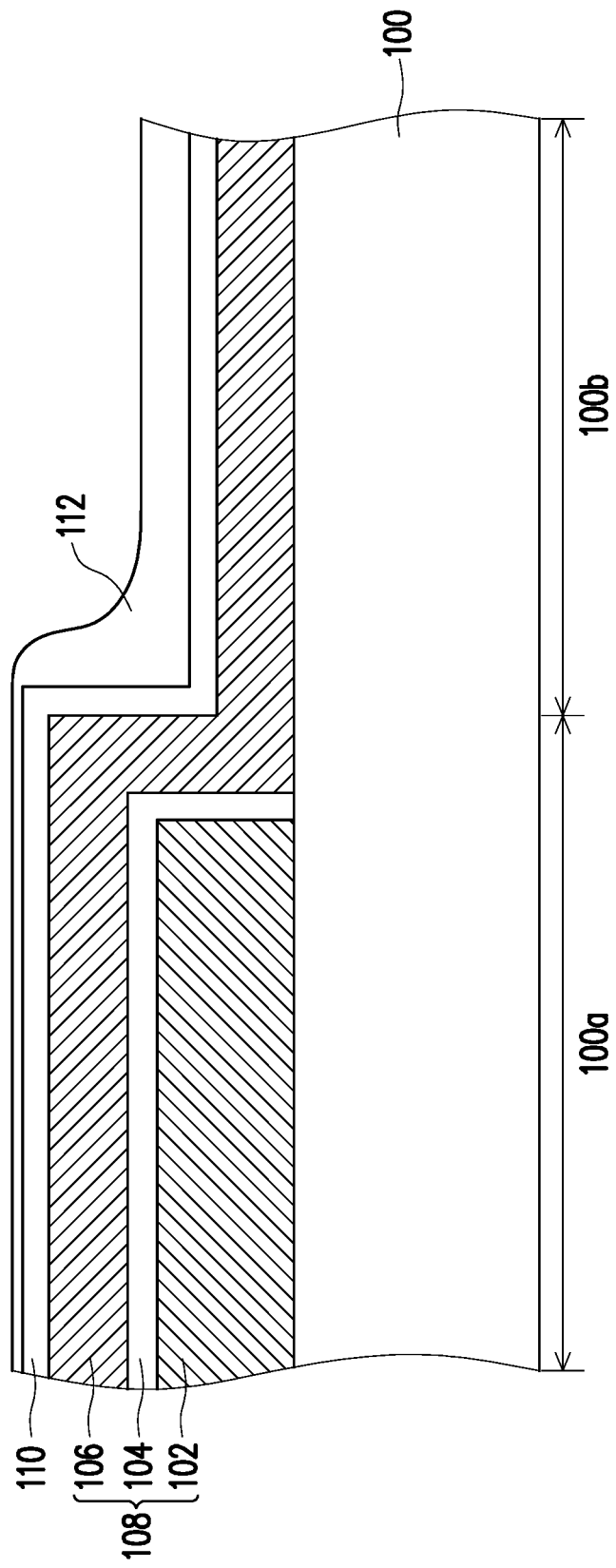

Referring to FIG. 1B, a protective layer 110 is formed on the conductive layer 106 (upper electrode). In this embodiment, the protective layer 110 is, for example, an oxide layer, but the invention is not limited thereto. The protective layer 110 is used to protect the conductive layer 106 to prevent the conductive layer 106 from being oxidized due to contact with the external environment in the subsequent process. Next, a dielectric layer 112 is formed on the protective layer 110. In this embodiment, the thickness of the dielectric layer 112 in the periphery region 100b is greater than the thickness of the dielectric layer 112 in the capacitor region 100a. It can be clearly seen from FIG. 1B that only a thin dielectric layer 112 is formed on the protective layer 110 in the capacitor region 100a after forming the dielectric layer 112. In one embodiment, the thickness of the dielectric layer 112 in the periphery region 100b is more than twice the thickness of the dielectric layer 112 in the capacitor region 100a. In order to form the dielectric layer 112 with the above-mentioned thickness characteristics, in this embodiment, a spin coating process is performed to form the dielectric layer 112. Based on the characteristics of the spin coating process, a portion of dielectric layer 112 with a larger thickness may be formed in the periphery region 100b and a portion of the dielectric layer 112 with a smaller thickness may be formed on the capacitor 108 in the capacitor region 100a without special adjustment of process parameters.

In addition, the dielectric layer 112 and the protective layer 110 must have etching selectivity. In other words, during the etching process, the etching rate of the dielectric layer 112 must be greater than the etching rate of the protective layer 110. In one embodiment, the dielectric layer 112 may be an oxide layer, and during the etching process, the etching rate of the dielectric layer 112 is greater than the etching rate of the protective layer 110.

Figure 1C:
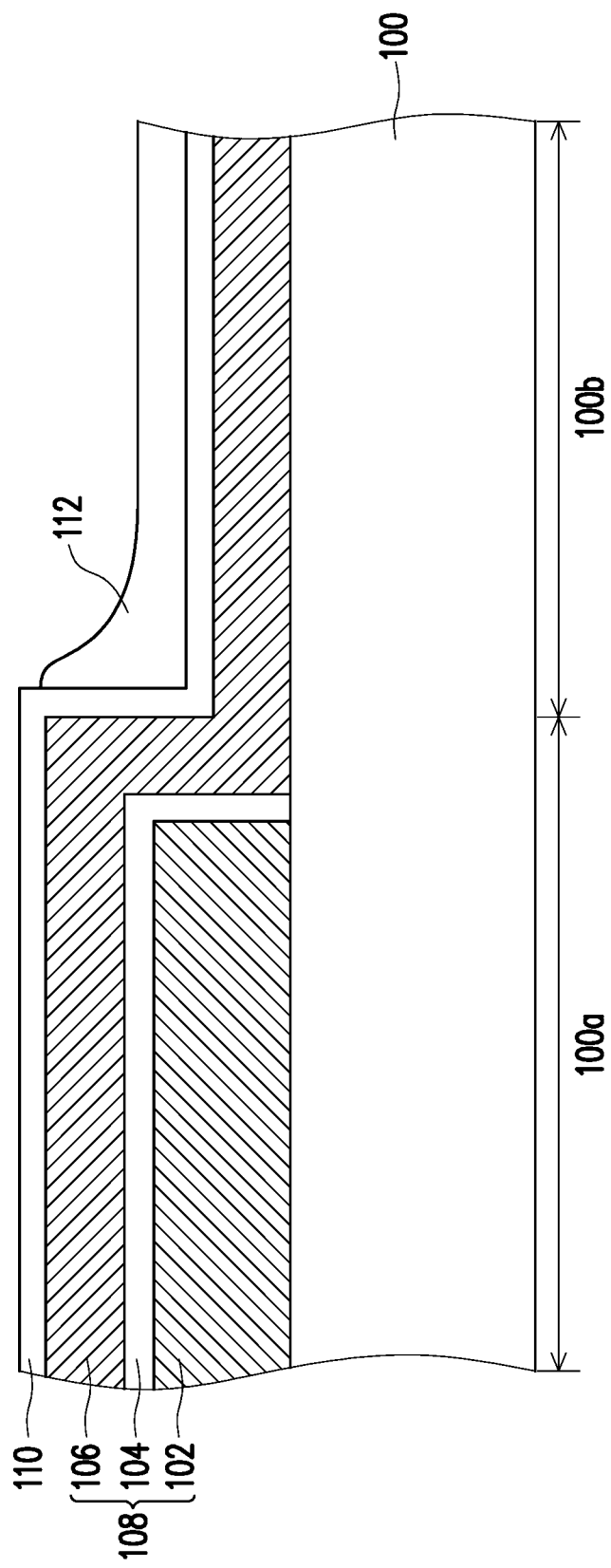

Referring to FIG. 1C, the dielectric layer 112 in the capacitor region 100a is removed to expose the protective layer 110 on the top surface of the capacitor 108. The method of removing the dielectric layer 112 in the capacitor region 100a is, for example, an anisotropic etching process. In the process of removing the dielectric layer 112 in the capacitor region 100a, the dielectric layer 112 in the periphery region 100b is also removed at the same time. Since the thickness of the dielectric layer 112 in the periphery region 100b is greater than the thickness of the dielectric layer 112 in the capacitor region 100a, after the dielectric layer 112 in the capacitor region 100a is completely removed, the dielectric layer 112 still remains in the periphery region 100b.

Figure 1D:
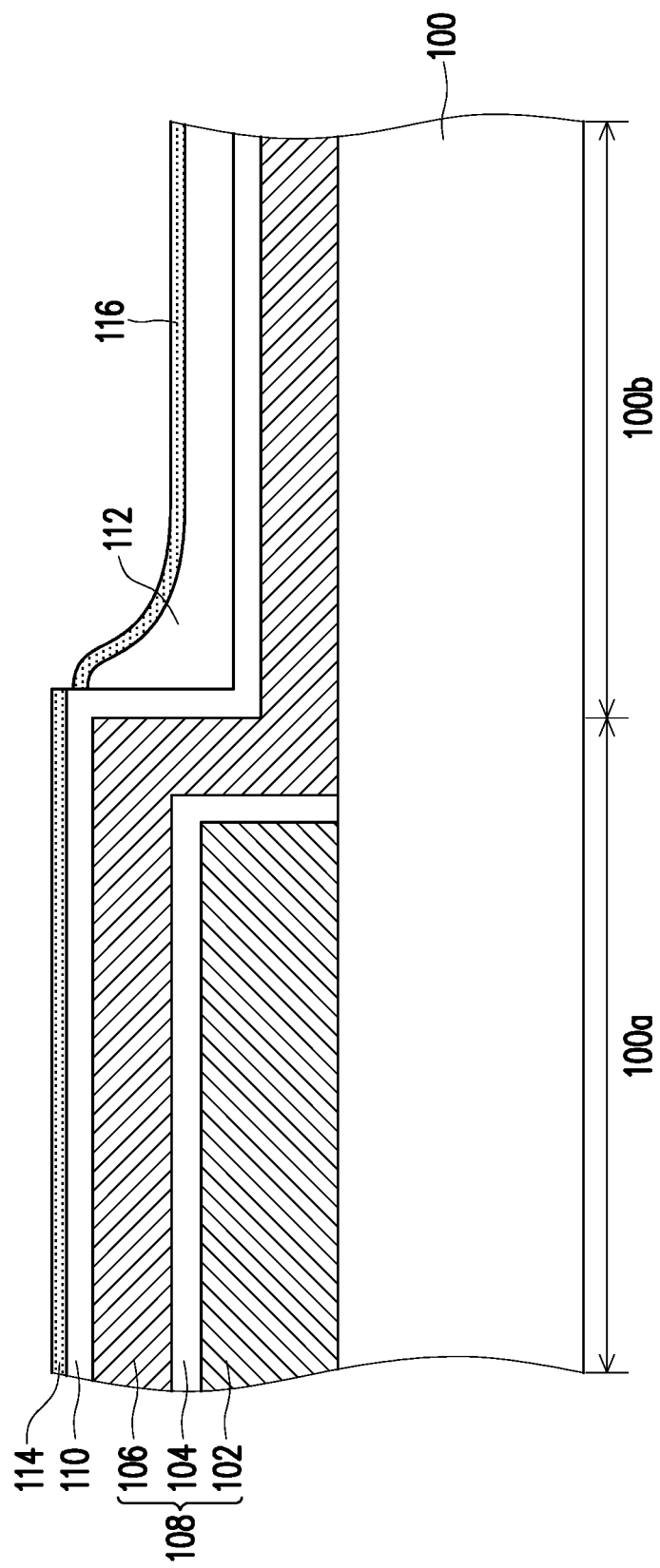

Referring to FIG. 1D, a doped layer 114 is formed on the surface of the protective layer 110 in the capacitor region 100a to change the etching characteristics of the protective layer 110. The method of forming the doped layer 114 is, for example, an implantation process. The dopants implanted in the above implantation process are, for example, silicon, germanium, arsenic or a combination thereof, but the present invention is not limited thereto. In this embodiment, during the implantation process, in addition to being implanted into the surface of the protective layer 110, the dopants are also implanted into the surface of the dielectric layer 112 to form the doped layer 116, but the invention is not limited thereto. In other embodiments, the dopants may also be implanted only in the protective layer 110.

In this embodiment, the doped layer 114 and the protective layer 110 have etching selectivity. In other words, during the etching process, the etching rate of the doped layer 114 is less than the etching rate of the protective layer 110, so as to serve as an etching mask on the protective layer 110.

In addition, in this embodiment, the doped layer 114 is only formed in the surface of the protective layer 110, but the invention is not limited thereto. In other embodiments, the doped layer 114 may also be formed in the entire protective layer 110, that is, the depth of the doped layer 114 is the thickness of the protective layer 110.

Figure 1E:
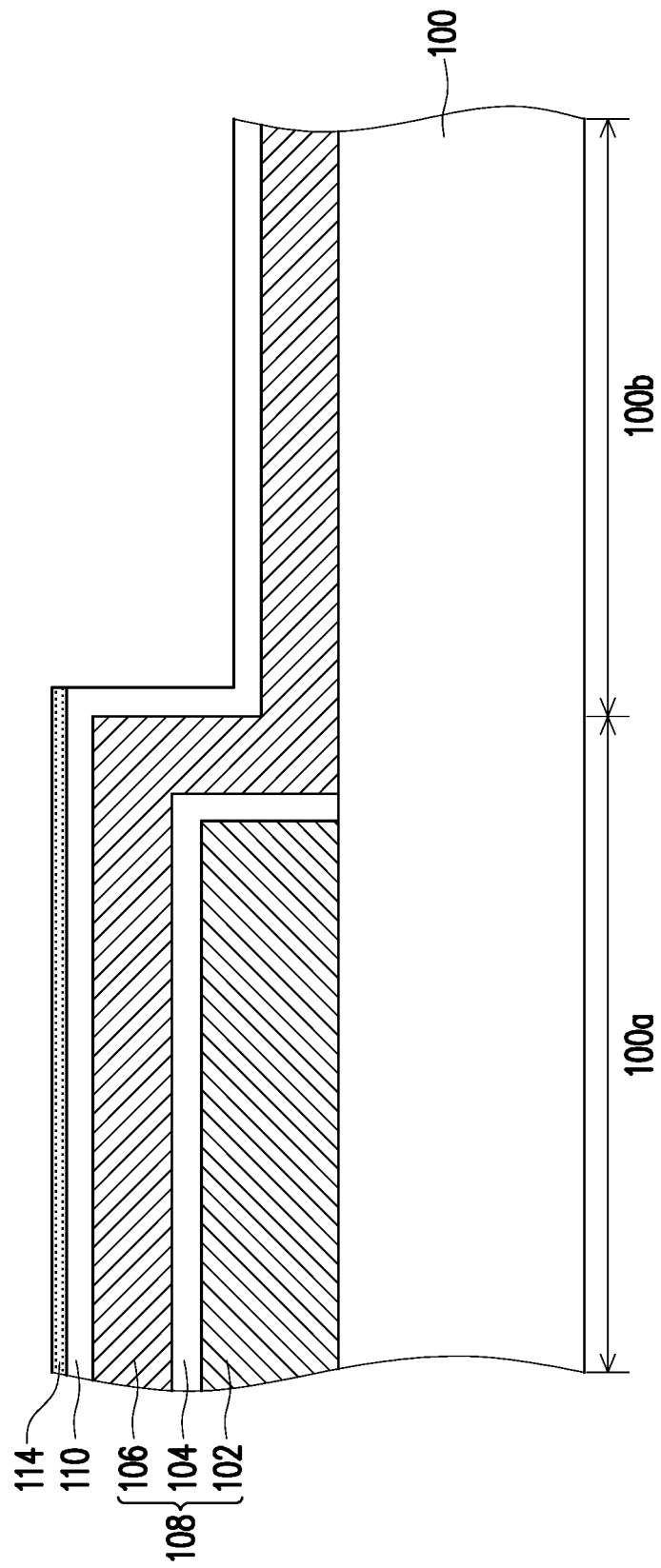

Referring to FIG. 1E, the remaining dielectric layer 112 is removed to expose the protective layer 110 in the periphery region 110b. The method of removing the dielectric layer 112 is, for example, an ash trip process. In this embodiment, since the doped layer 114 is formed in the surface of the protective layer 110, the protective layer 110 in the capacitor region 110a may be prevented from being removed during the process of removing the dielectric layer 112.

Figure 1F:
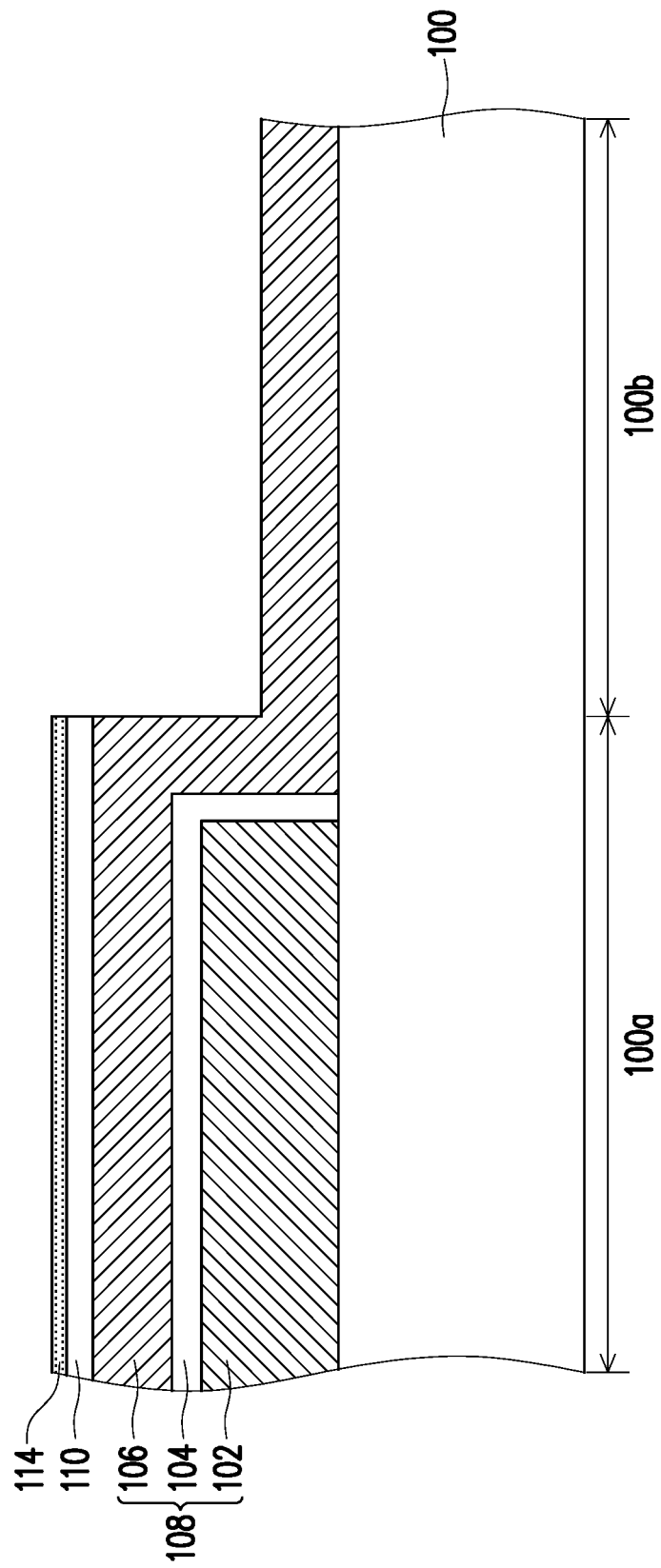

Referring to FIG. 1F, using the doped layer 114 as a mask, an etching process is performed to remove the protective layer 110 in the periphery region 100b, and expose the conductive layer 106 in the periphery region 100b. In this embodiment, the etching process is, for example, an isotropic etching process. In this embodiment, based on the characteristics of the isotropic etching process, in addition to removing the protective layer 110 in the periphery region 100b that is not covered by the doped layer 114, the protective layer 110 located at the boundary between the capacitor region 100a and the peripheral region 100b (that is, on the sidewall of the capacitor 108) may also be removed. In addition, depending on the time of the etching process, the slight doped layer 114 located at the boundary between the capacitor region 100a and the periphery region 100b may also be removed.

Figure 1G:
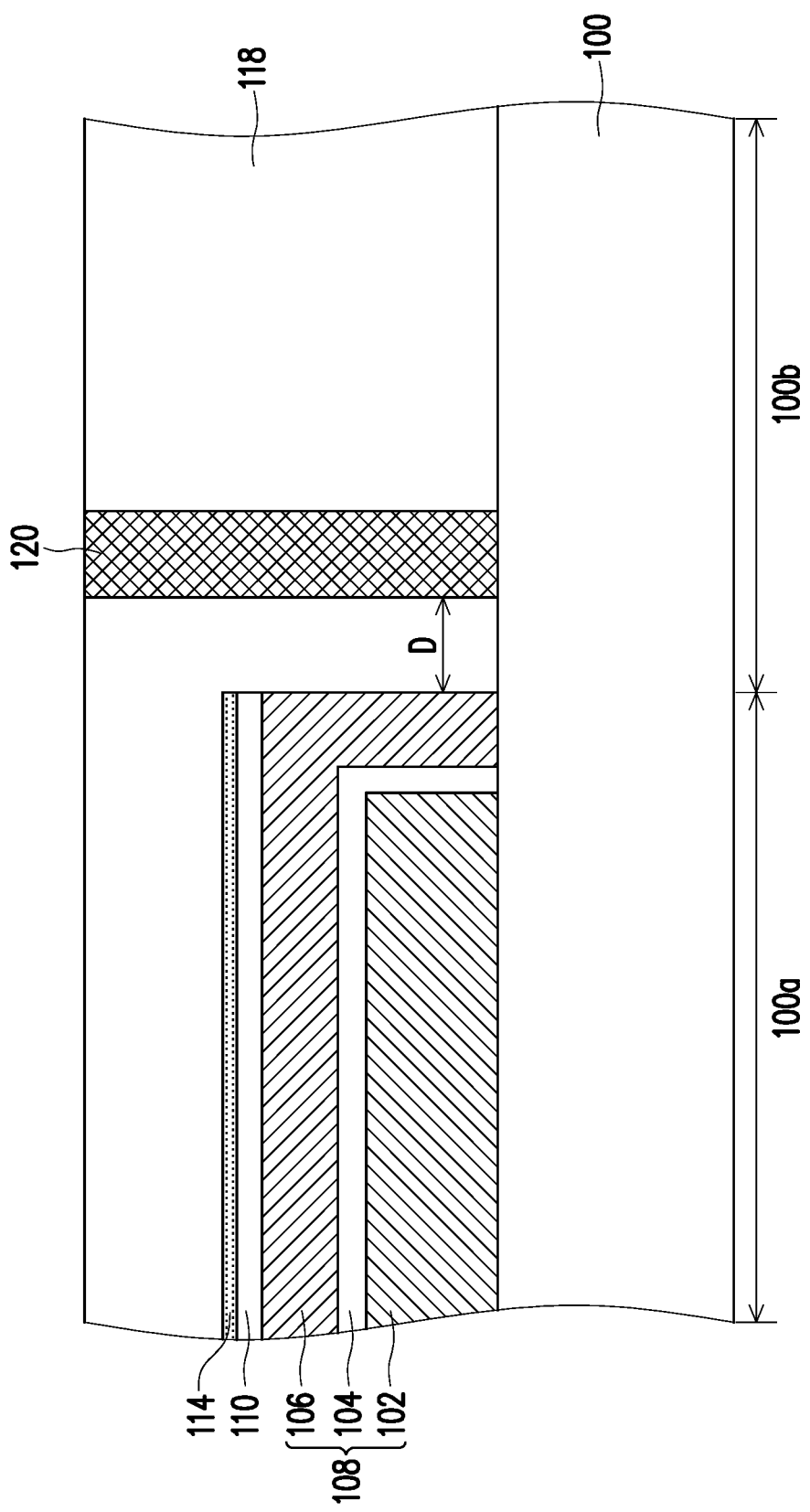

Referring to FIG. 1G, using the doped layer 114 as a mask, an etching process is performed to remove the conductive layer 106 in the periphery region 100b to expose the substrate 100. In this embodiment, the etching process is, for example, an anisotropic etching process. Since the doped layer 114 is only formed in the capacitor region 100a, the conductive layer 106 in the periphery region 110b can be completely removed. In addition, in this embodiment, the doped layer 114 is used as a mask to perform the etching process, so there is no need to additionally form a photoresist layer covering the capacitor region 100a. After that, the following well-known process may be performed. For example, a dielectric layer 118 covering the capacitor region 100a and the periphery region 110b is formed on the substrate 100, and a contact 120 connected to a conductive device (not shown) in the substrate 100 is formed in the dielectric layer 118.

In this embodiment, since the conductive layer 106 in the periphery region 110b has been completely removed, the position of the contact 120 may be as close as possible to the capacitor 108 without being in contact with the capacitor 108. In other words, the distance D between the contact 120 and the capacitor region 100a (or the capacitor 108) may be minimized, thereby achieving the purpose of reducing the chip size.

The semiconductor structure of the present invention will be described below by taking FIG. 1G as an example. Referring to FIG. 1G, the semiconductor structure of the present invention includes a substrate 100 and a capacitor 108. The capacitor 108 is disposed on the substrate 100 in the capacitor region 100a and is electrically connected to a transistor (not shown) in the substrate 100. In addition, the conductive layer 106 as the upper electrode of the capacitor 108 does not extend into the periphery region 100b. The semiconductor structure of the present invention may further include a contact 120 disposed in the periphery region 100b and electrically connected to a conductive device (not shown) in the substrate 100. Since the upper electrode (conductive layer 106) of the capacitor 108 does not extend into the periphery region 100b, the position of the contact 120 may be as close as possible to the capacitor 108 without being in contact with the capacitor 108. That is, the distance D between the contact 120 and the capacitor region 100a (or capacitor 108) may be minimized to achieve the purpose of reducing the chip size.

In the above embodiment, the capacitor 108 including the conductive layer 102 (lower electrode), the dielectric layer 104 (capacitor dielectric layer) and the conductive layer 106 (upper electrode) is a flat capacitor well known to those skilled in the art, but the present invention does not limited thereto. In other embodiments, the capacitor 108 may be other types of capacitors, such as a cup-shaped capacitor, and the manufacturing method of the semiconductor structure with such capacitor is the same as that described in FIGS. 1A to 1G, and will not be further described here.

It will be apparent to those skilled in the art that various modifications and variations can be made to the disclosed embodiments without departing from the scope or spirit of the disclosure. In view of the foregoing, it is intended that the disclosure covers modifications and variations disposed that they fall within the scope of the following claims and their equivalents.

What is claimed is:

1. A semiconductor structure, comprising:
   a substrate, having a capacitor region and a periphery region, wherein a transistor is disposed in the substrate in the capacitor region, and a conductive device is disposed in the substrate in the periphery region;
   a capacitor, disposed on the substrate in the capacitor region and electrically connected to the transistor, wherein an upper electrode of the capacitor does not extend into the periphery region; and
   a protective layer, disposed on the upper electrode of the capacitor, wherein a lower surface of the protective layer is only in contact with the upper electrode, and the protective layer comprises a doped region and a top surface of the doped region is coplanar with a top surface of the protective layer,
   wherein the doped region comprises a doped material of an undoped region of the protective layer.

2. The semiconductor structure of claim 1, wherein the doped region is disposed in the entire protective layer.

3. The semiconductor structure of claim 1, wherein the dopants in the doped region comprise silicon, germanium, arsenic, or a combination thereof.

4. The semiconductor structure of claim 1, further comprising a contact, disposed in the periphery region and electrically connected to the conductive device.

5. The semiconductor structure of claim 4, wherein the contact is not in contact with the capacitor.

6. The semiconductor structure of claim 1, wherein the capacitor comprises:
   a lower electrode, disposed on the substrate;
   a capacitor dielectric layer, covering a top surface and a sidewall of the lower electrode; and
   the upper electrode, disposed on the capacitor dielectric layer.

7. The semiconductor structure of claim 6, wherein a part of the upper electrode is located at a boundary between the capacitor region and the peripheral region.

8. The semiconductor structure of claim 1, wherein the capacitor comprises a flat capacitor or a cup-shaped capacitor.

9. The semiconductor structure of claim 1, wherein the substrate comprises a dielectric layer formed on a silicon base.

* * * * *